(12) United States Patent
Adam et al.

(10) Patent No.: US 7,544,577 B2
(45) Date of Patent: Jun. 9, 2009

(54) MOBILITY ENHANCEMENT IN SIGE HETEROJUNCTION BIPOLAR TRANSISTORS

(75) Inventors: Thomas N. Adam, Poughkeepsie, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 11/212,187

(22) Filed: Aug. 26, 2005

(65) Prior Publication Data

US 2007/0045775 A1 Mar. 1, 2007

(51) Int. Cl.
*H01L 21/331* (2006.01)

(52) U.S. Cl. ............................ 438/344; 438/345

(58) Field of Classification Search ............... 257/552, 257/198, 197; 438/344, 345
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,352,912 A * | 10/1994 | Crabbe et al. | ............... 257/198 |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |

(Continued)

FOREIGN PATENT DOCUMENTS

JP 64-76755 3/1989

(Continued)

OTHER PUBLICATIONS

Kern Rim, et al., "Transconductance Enhancement in Deep Submicron Strained-Si n-MOSFETs", International Electron Devices Meeting, 26, 8, 1, IEEE, Sep. 1998.

(Continued)

*Primary Examiner*—Roy K Potter
(74) *Attorney, Agent, or Firm*—Scully, Scott, Murphy & Presser, P.C.; Joseph P. Abate, Esq.

(57) ABSTRACT

The present invention relates to a high performance heterojunction bipolar transistor (HBT) having a base region with a SiGe-containing layer therein. The SiGe-containing layer is not more than about 100 nm thick and has a predetermined critical germanium content. The SiGe-containing layer further has an average germanium content of not less than about 80% of the predetermined critical germanium content. The present invention also relates to a method for enhancing carrier mobility in a HBT having a SiGe-containing base layer, by uniformly increasing germanium content in the base layer so that the average germanium content therein is not less than 80% of a critical germanium content, which is calculated based on the thickness of the base layer, provided that the base layer is not more than 100 nm thick.

17 Claims, 4 Drawing Sheets

U.S. PATENT DOCUMENTS

| | | | |
|---|---|---|---|
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,716 | A | 8/1999 | Jin et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,552,375 | B2 * | 4/2003 | Swanson et al. ............ 257/198 |
| 6,621,392 | B1 | 9/2003 | Volant et al. |
| 6,635,506 | B2 | 10/2003 | Volant et al. |
| 6,780,735 | B2 * | 8/2004 | Jagannathan et al. ........ 438/510 |
| 6,831,292 | B2 | 12/2004 | Currie et al. |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |

OTHER PUBLICATIONS

Kern Rim, et al., "Characteristics and Device Design of Sub-100 nm Strained Si N— and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Perfomance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors- Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater et al., *SiGe HBT Technology with fmax/fT=350/300 GHz and Gate Delay Below 3.3 ps*, IEEE Electron Devices Meeting, IEDM Technical Digest, 247-250 (2004).

J.C. Bean et al., *GexSi1-x/Si Strained—Layer Superlattice Grown by Molecular Beam Epitaxy*, A 2 J. Vac. Sci. Technol, 436-440 (1894).

J.H. Van Der Merwt, *Crystal Interfaces. Part I. Semi-Infinite Crystals*, 34 J. of Appl. Phys., 117-122 (1963).

J.W. Mathews and A.E. Blakeslee, *Defects in Epitaxial Multilayers I. Misfit Dislocations in Layers*, 27 J. Crystal Growth, 118-125 (1974).

S.S. Iyer et al., Heterojunction Bipolar Transistors Using Si-Ge Alloys, 36 IEE Transactions on Electron Devices, 2043-2064 (1989).

R.H.M. van de Leur et al., *Critical Thickness for Pseudomorphic growth of Si/Ge Alloys and Superlattices*, 64 J. Appl. Phys., 3043-3050 (1988).

D.C. Houghton et al., *Equilibrium Critical Thickness for Si1-xGex Strained Layers on (100) Si*, 56 Appl. Phys. Lett. 460-462 (1990).

* cited by examiner

MOBILITY ENHANCEMENT IN SIGE HETEROJUNCTION BIPOLAR TRANSISTORS

FIELD OF THE INVENTION

The present invention relates to a SiGe-based heterojunction bipolar transistor, and more particularly, to a SiGe-based heterojunction bipolar transistor that has improved performance due to mobility enhancement. The present invention is also related to a method of fabricating such a SiGe-based heterojunction bipolar transistor.

BACKGROUND OF THE INVENTION

In the state-of-the-art SiGe heterojunction bipolar transistor (HBT) devices, the base material is epitaxially deposited by means of chemical vapor deposition (CVD) or molecular beam epitaxy (MBE) as front-end-of-line (FEOL) films relatively early in the manufacturing process. This offers the possibility of tailoring specific base profiles in both alloy and dopant and allows pseudomorphic growth of alloys of silicon with germanium and carbon, which can be used to improve performance of the HBT devices.

Specifically, incorporation of substitutional germanium into the crystal lattice of the silicon creates a compressive strain in the material, because the Ge atom requires a larger atomic separation. It also reduces the bandgap of the material. In some SiGe-based heterojunction bipolar transistor (HBT) devices, the Ge content increases abruptly to a constant value across the entire base region (single rectangular profile) or parts thereof (stepped profile). In a "graded" SiGe HBT device, the Ge content in the base region is not a constant, but instead increases from a low Ge concentration near the emitter-base junction to a high Ge concentration deeper into the base region, thus creating a drift field with decreasing bandgap in the direction of the electron flow. The electrons injected from the emitter of the HBT device face a reduced injection barrier due to the low Ge concentration at the emitter-base junction, and then experience an accelerating field across the base region due to the increasing Ge content deeper into the base region. The low Ge content at the emitter-base junction increases the electron injection into the base, thus increasing the current gain. The Ge grading in the base region has the effect of speeding the transport of electrons across the device, resulting in reduced transit time through the base, which is of particular importance in scaling the device to a higher-speed performance. Such a desired Ge grading can be readily created by time-dependent programming of the Ge precursor flows during the SiGe film deposition.

However, when the strain in the pseudomorphically grown SiGe film reaches a critical level, either due to increase of the SiGe film thickness or increase of the Ge content, it can no longer be contained by elastic energy stored in the distorted SiGe crystal structure. Instead, a portion of the strain will be relaxed through generation of misfit dislocations in the heteroepitaxial interface. Therefore, for a SiGe film of a specific Ge content, there exists a "critical thickness," defined as the maximum thickness for the pseudomorphic growth of the SiGe film, below which the strain caused by lattice mismatch between Si and Ge is contained by elastic energy stored in crystal lattice distortion, and above which a portion of the strain is relaxed through generation of misfit dislocations in the heteroepitaxial interface. Similarly, for a SiGe film of a specific thickness, there exists a "critical Ge content," which is defined as the maximum germanium content that can be incorporated into the pseudomorphic SiGe film, below which the strain caused by lattice mismatch between Si and Ge is contained by elastic energy stored in crystal lattice distortion, and above which a portion of the strain is relaxed through generation of misfit dislocations in the heteroepitaxial interface.

Dislocation defects originated from strain relaxation are electrically active and can cause increased carrier scattering, carrier trapping, and carrier recombination. Therefore, in the past, the Ge content and total thickness of a SiGe base layer were carefully designed not to exceed the critical values, in order to avoid formation of dislocation defects in the device structure.

Recent aggressive scaling of the SiGe HBT devices in both the vertical and lateral directions has led to significant reductions in device dimensions, including significant reduction in the base layer thickness. Further, recent high-frequency measurements indicate that carriers traveling through ultra-thin base layers of high-performance HBTs (e.g., having a thickness of not more than about 100 nm) have already reached a saturation velocity at the today's aggressive Ge grading. In other words, increased Ge grading in the ultra-thin base layers does not yield further improvements in carrier velocity.

As a result, state-of-the-art SiGe-based HBT devices (see Khater et al., "SiGe HBT Technology with $fMax/fT$=350/300 GHz and Gate Delay Below 3.3 ps," IEEE Electron Devices Meeting IEDM Technical Digest, 13-15 Dec. 2004 pp. 247-250) have base layers with Ge content and thickness that are well below the critical values.

SUMMARY OF THE INVENTION

The present invention seeks to further improve performance of currently available SiGe-based HBT devices by increasing biaxial strain in the base region of the HBT devices, which in turn increases carrier mobility in the base region.

The present invention discovers that although a further increase in the Ge content of the ultra-thin base layers of the currently available SiGe-based HBT devices does not further increase carrier velocity, it can cause increase in biaxial strains near the base region, i.e., increased compressive strain along the direction parallel to the substrate surface (i.e., the lateral direction) and increased tensile strain along the direction perpendicular to the substrate surface (i.e., the vertical direction), which functions to enhance mobility of holes laterally flowing through the base region and electrons vertically traversing the base region.

Since the carrier base-transit time depends not only on carrier velocity, but also on carrier mobility, the carrier base-transit time of the currently available SiGe-based HBT devices can be further reduced by increasing the Ge content of the ultra-thin base layers of such HBT devices to near-critical value.

Further, the base resistance of the SiGe-based HBT devices also depends on the carrier mobility, so an increase of the base layer Ge content to near-critical value can also be used to reduce the base resistance.

In one aspect, the present invention relates to a HBT device containing a collector region, a base region, an extrinsic base region, and an emitter region. The base region of the HBT device comprises an ultra-thin SiGe-containing layer, i.e., having a thickness of not more than about 100 nm. A critical germanium content can be predetermined for such an ultra-thin SiGe-containing layer, based on its thickness, and the SiGe-containing layer is arranged and constructed so that it has a germanium content profile with an average germanium content of not less than about 80% of the predetermined critical germanium content.

Preferably, the average germanium content in the ultra-thin SiGe-containing layer is not less than 90%, more preferably not less than 95%, and still more preferably not less than 99%, of the predetermined critical germanium content. Most preferably, the average germanium content in the ultra-thin SiGe-containing layer is substantially equal to (i.e., with ±0.1% difference) the predetermined critical germanium content.

Critical germanium content for the ultra-thin SiGe-containing layer can be readily calculated by various conventionally known methods, as described hereinafter in greater detail, and the present invention selects the average calculated critical germanium content for controlling the actual germanium content in the SiGe-containing layer, so as to minimize the risk of dislocation generation. For example, for a SiGe-containing layer of about 50 nm thick, the calculated critical germanium content is between about 16 atomic % to about 18 atomic %, while the average value of 17 atomic % is selected as the predetermined critical germanium content in the present invention. For another example, the calculated critical germanium content of a 100 nm thick SiGe-containing layer is between about 9 atomic % to about 11 atomic %, and the average value of 10 atomic % is selected as the predetermined critical germanium content for practice of the present invention.

The ultra-thin SiGe-containing layer of the present invention may have a flat Ge content profile (i.e., a substantially uniform Ge content is provided across the entire SiGe-containing layer), a multi-step Ge content profile (i.e., multiple plateaus of uniform Ge content are provided across the entire SiGe-containing layer), or a graded Ge content profile (i.e., the Ge content changes in the SiGe-containing layer). The term "Ge content profile" or "germanium content profile" as used herein refers to a plot of germanium contents in a structure as a function of thickness or depth in the structure. Preferably, the ultra-thin SiGe-containing layer has a graded Ge content profile, which may have any suitable shape, either regular or irregular. For example, such an ultra-thin SiGe-containing layer may have a triangular Ge content profile, or a trapezoidal Ge content profile.

For a simple (i.e., stepped) or complicated (graded) SiGe-containing layer, the "average Ge content" is determined by first integrating the Ge content over the entire SiGe-containing layer, i.e., so as to determine the total or integrated Ge content in the layer, and then dividing the integrated Ge content over the thickness of the layer. A SiGe-based HBT is found to be stable in further high-temperature processing steps, which are required to finish the HBT device, as long as the average Ge content in the base layer of such a SiGe-based HBT device remains below or equal to a critical Ge content corresponding to the thickness of the base layer. The critical Ge content can be readily determined, for example, from the Matthew/Blakeslee line (MBL) that is to be described in greater detail hereinafter. Moreover, certain deposition techniques, such as ultra-high vacuum chemical vapor deposition (UHVCVD) and high-temperature bake-conditioned remote plasma-enhanced chemical vapor deposition (RPCVD), allow the SiGe-containing base layer to be deposited with an average Ge content that is very close (more than 95%) to the critical Ge content.

In another aspect, the present invention relates to a heterojunction bipolar transistor that comprises a SiGe-containing base layer having a thickness of not more than about 50 nm and a germanium content profile with an average germanium content ranging from about 16.5 atomic % to about 17.5 atomic %.

In a further aspect, the present invention relates to a method for enhancing carrier mobility in a heterojunction bipolar transistor that has an ultra-thin SiGe-containing base layer, without changing quasi-static drift field of the base layer. The quasi-static drift field of a SiGe-containing layer depends on the Ge grading rate or the shape of the Ge content profile, but not the absolute Ge content, in the SiGe-containing layer.

Therefore, a uniform increase in the Ge content across the ultra-thin SiGe-containing base layer can be used to reach near-critical Ge content in the base layer, thereby maximizing the biaxial strain and the carrier mobility in the base layer, but it does not change the Ge grading rate or the shape of the Ge content profile and thus maintains the same quasi-static drift field in the base layer.

In one embodiment, the method of the present invention comprises:
  measuring the thickness of the SiGe-containing base layer;
  calculating a critical germanium content based on the thickness of the SiGe-containing base layer;
  measuring germanium content in the SiGe-containing base layer to determine the germanium content profile of said SiGe-containing base layer; and
  changing the germanium content profile of the SiGe-containing base layer, by uniformly increasing the germanium content in the SiGe-containing base layer by a sufficient amount so that the changed germanium content profile has an average germanium content of not less than about 80% of the calculated critical germanium content.

In a still further aspect, the present invention provides a method for fabricating a high performance SiGe-based HBT device, by:
  determining a projected thickness and a projected germanium profile for a SiGe-containing base layer of the SiGe-based HBT device, wherein said projected thickness is not more than about 100 nm;
  calculating a critical germanium content based on the projected thickness and an average germanium content based on the projected germanium profile and the critical germanium content, wherein said average germanium content is not less than 80% of the critical germanium content;
  forming a collector for the HBT device in a semiconductor substrate;
  depositing over the collector a SiGe-containing base layer, which has the projected thickness, the projected germanium profile, and the calculated average germanium content; and
  forming an extrinsic base and an emitter for the HBT device.

The projected thickness and the projected germanium profile can be readily determined by theoretical band-structure calculations and historical base profile scaling, which are known in the art and therefore are not described in detail herein. Preferably, the projected germanium profile provides for germanium grading over the base layer, which establishes a quasi-static drift field for accelerating carriers across the base layer.

Other aspects, features and advantages of the invention will be more fully apparent from the ensuing disclosure and appended claims.

DETAILED DESCRIPTIONS OF THE INVENTION, AND PREFERRED EMBODIMENTS THEREOF

Figure 1:
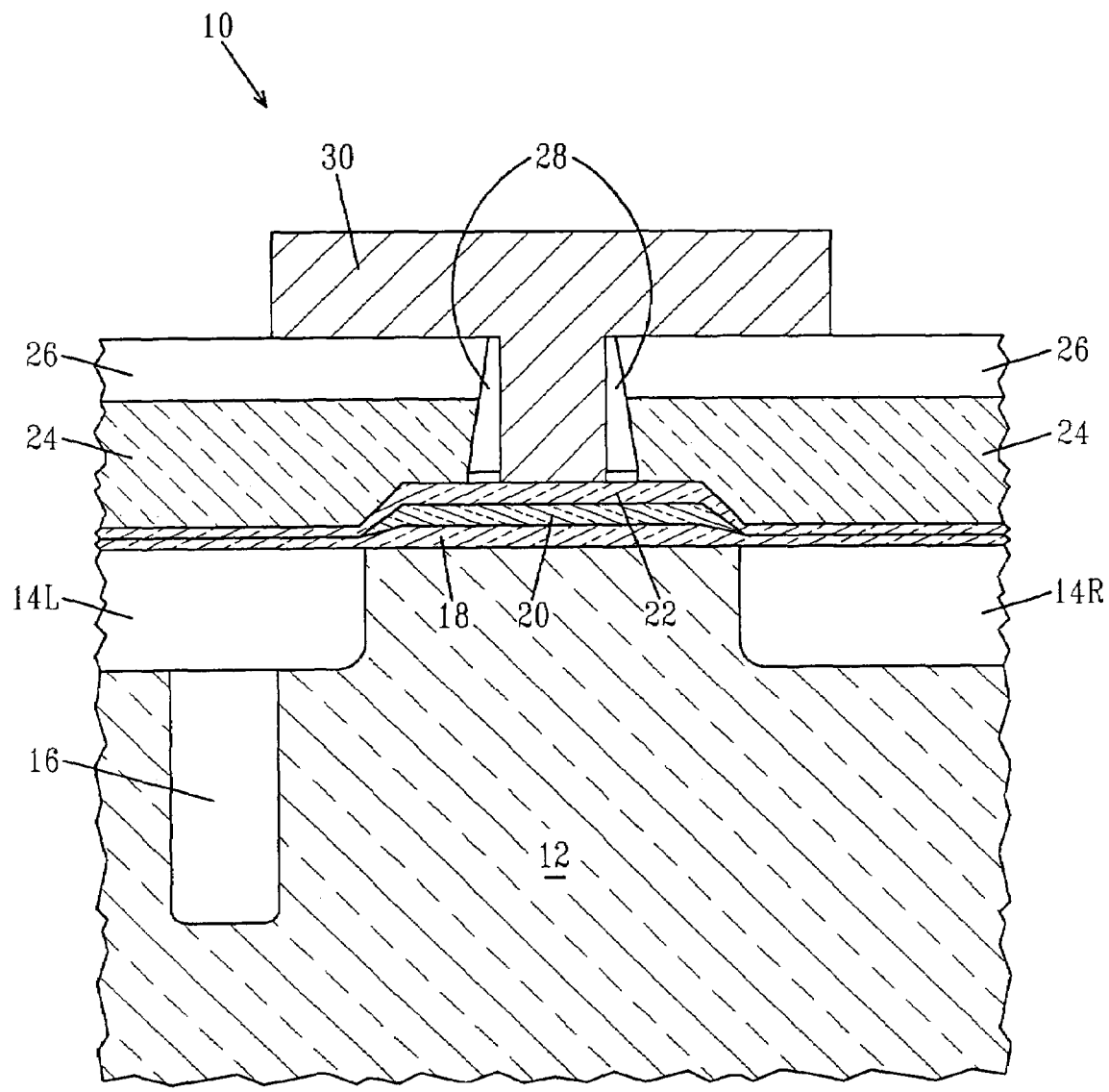
FIG. 1 shows a cross-sectional view of an exemplary prior art SiGe-based HBT device.

A typical SiGe-based HBT having a deep trench isolation and a T-shaped emitter is shown in FIG. 1 (hereinafter FIG. 1). Specifically, FIG. 1 includes a semiconductor structure 10 that includes at least a collector 12 that is positioned between two shallow trench isolations regions 14R and 14L. The shallow trench isolation region on the left hand side of the drawing, represented by 14L, has a deep trench 16 extending from a bottom walled surface of the shallow trench. The semiconductor structure shown in FIG. 1 also includes a first epitaxial silicon layer 18, a SiGe base 20, and a second epitaxial silicon layer 22, which are located atop the trench isolation regions and the collector 12. The structure shown in FIG. 1 also includes an extrinsic base 24 and an oxide layer 26 which are patterned to expose a surface of the second epitaxial silicon layer 22 that is located above the SiGe base 20. Nitride spacers 28 are located on sidewalls of the oxide layer 26 and the extrinsic base 24. A T-shaped emitter 30 is present in the structure as shown in FIG. 1.

The HBT shown in FIG. 1A is fabricated utilizing conventional bipolar processing techniques that are well known in the art. For example, a heterojunction Si-containing base, particularly comprised of SiGe, is epitaxially grown on a collector pedestal surrounded by isolation oxide.

During epitaxial growth, sophisticated boron, germanium, and carbon content profiles (with either exponential or polynomial ramps) can readily be created by time dependent programming of precursor flows. Graded germanium content profiles are desirable for creating built-in drift fields that accelerate carriers across the otherwise neutral base region of the transistor, thus drastically reducing the transit time.

Although germanium content profiles and germanium grading in conventional SiGe-based HBT devices were used to be limited by the critical thickness and critical germanium content of the SiGe base layer, recent aggressive scaling of the SiGe HBT devices has led to significant reductions in device dimensions, including significant reduction in the base layer thickness. Further, since recent studies indicate that carriers traveling through ultra-thin base layers have already reached a saturation velocity at the today's moderate Ge grading and that increased Ge grading in the ultra-thin base layers does not yield further improvements in carrier velocity, currently available SiGe-based HBT devices have base Ge content well below the critical value.

Figure 2:
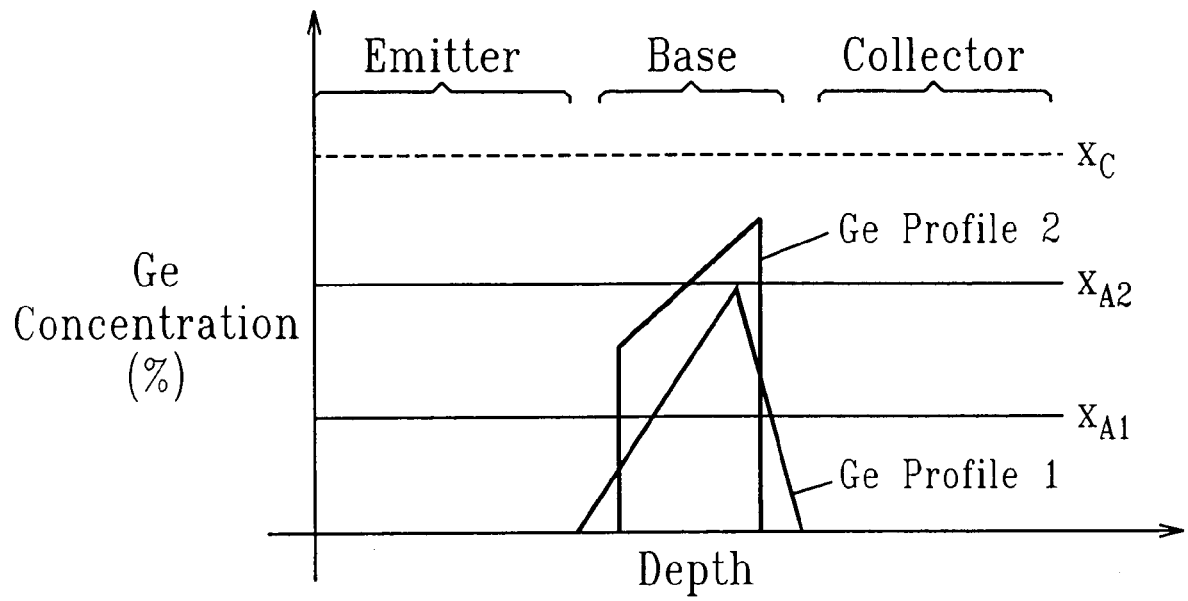
FIG. 2 shows two prior art base Ge content profiles for SiGe-based HBT devices.

FIG. 2 shows two exemplary graded Ge profiles in currently available SiGe-based HBT devices. The average Ge contents for these two graded Ge profiles ($X_{A1}$ and $X_{A2}$, respectively) are well below the critical Ge content ($X_c$) of the ultra-thin SiGe base layers of such devices.

The present invention discovers that although further increase in the Ge content of the ultra-thin base layers of the currently available SiGe-based HBT devices does not further increase carrier velocity, it can cause increase in biaxial strains near the base region, thereby enhancing carrier mobility in the base region and reducing the carrier base-transit time as well as the base resistance in the SiGe-based HBT devices.

Therefore, the present invention utilizes near-critical average Ge content in the ultra-thin base region of a SiGe HBT, so as to increase carrier mobility and further reduce base resistance and carrier transit time through the neutral base region. The method described by the present invention can be used to modify and improve the performance of an existing SiGe HBT device, or to fabricate a high performance SiGe HBT device ab initio.

In order to maintain the same drift fields created by the graded Ge content profiles in the ultra-thin base region of the existing SiGe HBT, the present invention proposes modification of the existing SiGe HBT, by uniformly increasing the germanium content in the SiGe base layer of the existing HBT device by a sufficient amount so that the average germanium content of the SiGe base layer is close to, or at least near, 80% of the critical germanium content.

Figure 3:
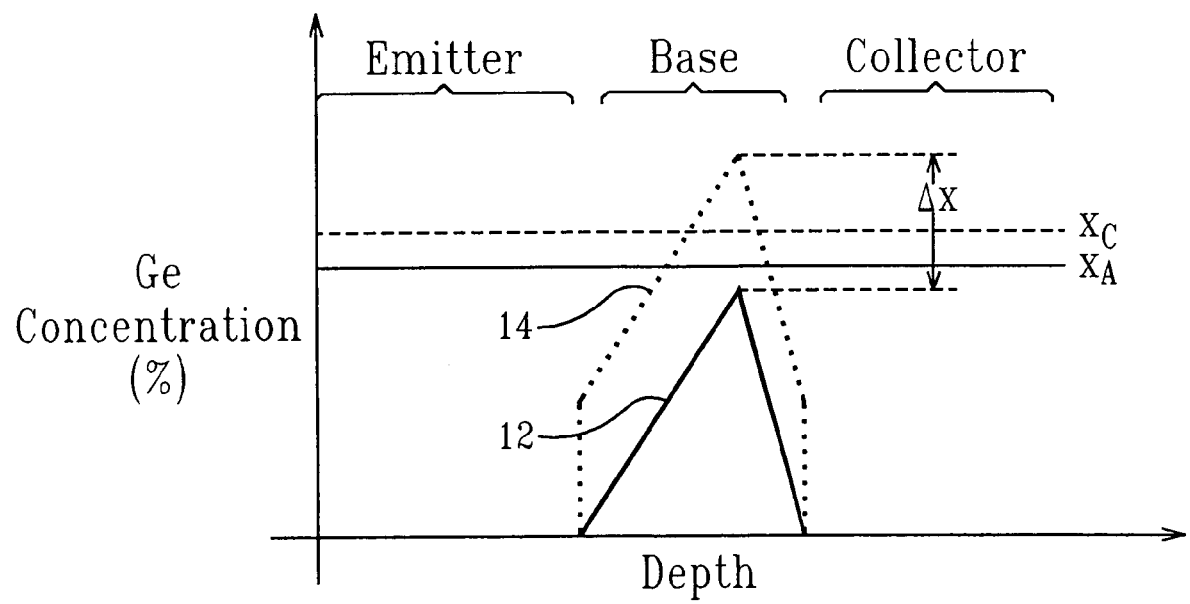
FIG. 3 shows an improved base Ge content profile for a high performance SiGe HBT device, in comparison with a prior art base Ge content profile, according to one embodiment of the present invention.

FIG. 3 shows a graded Ge content profile 14, which is created by uniformly increasing Ge content in the graded Ge content profile 12 of an existing SiGe HBT device having an ultra-thin base region, according to one embodiment of the present invention. The increased Ge content is referred to as x, and the average Ge content ($X_A$) in the new graded Ge content profile 14 is significantly closer to the critical germanium content ($X_c$) than the average Ge content (not shown) in the prior art Ge content profile 12.

Figure 4:
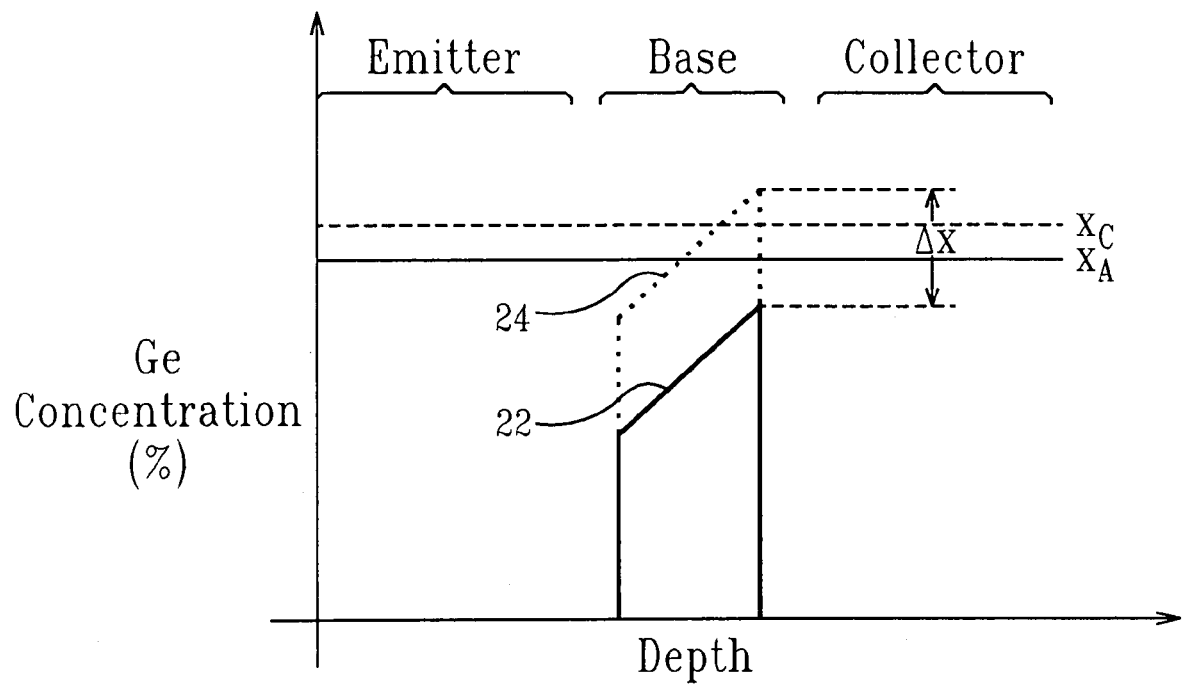
FIG. 4 shows another improved base Ge content profile for a high performance SiGe HBT device, in comparison with a prior art base Ge content profile, according to one embodiment of the present invention.

Similarly, FIG. 4 shows a graded Ge content profile 24, which is created by uniformly increasing Ge content (by x) in the prior art graded Ge content profile 22 of an existing SiGe HBT device having an ultra-thin base region, according to one embodiment of the present invention. The average Ge content ($X_A$) in the new graded Ge content profile 14 is significantly closer to the critical germanium content ($X_C$) than the average Ge content (not shown) in the prior art Ge content profile 12.

Figure 5:
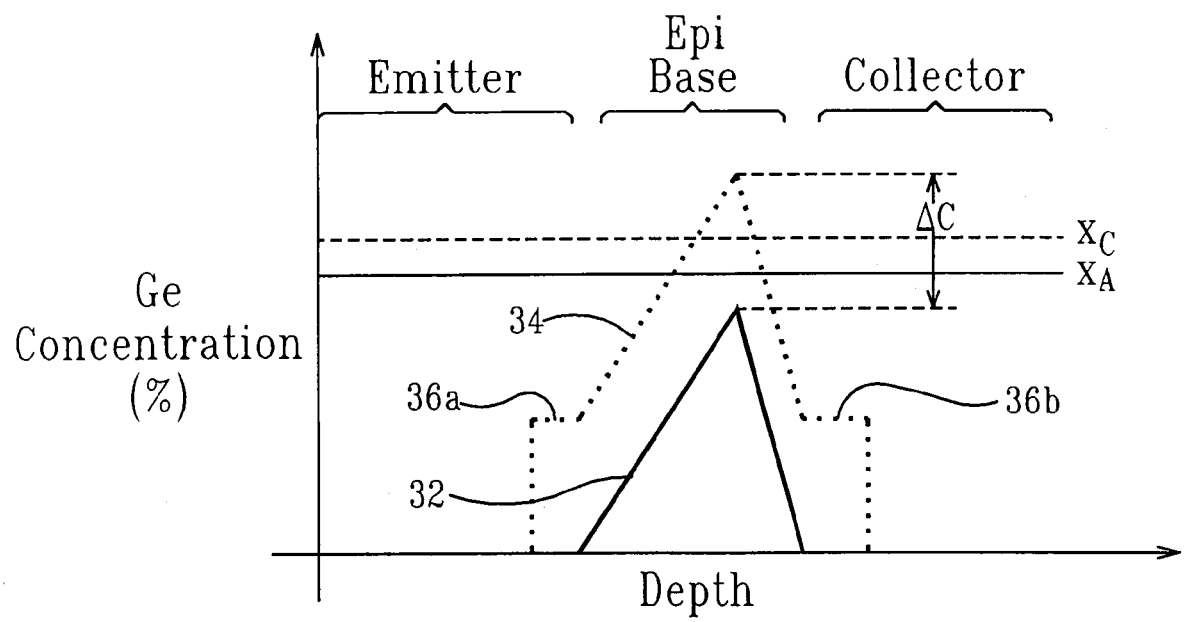
FIG. 5 shows yet another improved base Ge content profile for a high performance SiGe HBT device, in comparison with a prior art base Ge content profile, according to one embodiment of the present invention.

FIG. 5 shows another graded Ge content profile 34, which is created by uniformly increasing Ge content by x in both the ultra-thin SiGe base region of an existing SiGe HBT and the two epitaxial silicon layers flanking the ultra-thin SiGe base (i.e., layers 18 and 22 of FIG. 1), according to another embodiment of the present invention. The Ge content increases in the two epitaxial silicon layers are indicated by ramps 36a and 36b in FIG. 5, and the average Ge content ($X_A$) in the new graded Ge content profile 34 is significantly closer to the critical germanium content ($X_c$) than the average Ge content (not shown) in the prior art Ge content profile 32.

Therefore, the increase in Ge content can be either limited to only the ultra-thin SiGe base region, so that the epitaxial silicon layers flanking such an ultra-thin SiGe base consist essentially of silicon, with little or no Ge therein, or it can be extended to also the flanking epitaxial silicon layers, forming an extended SiGe epitaxial base region.

The present invention provides a method to enhance the carrier mobility in a SiGe-based HBT device while reducing the base resistance of the transistor. In accordance with the present invention, carrier mobility enhancement is achieved by changing the Ge profile in the ultra-thin base region of the HBT device, without negatively impacting the drift fields that are typically associated with bipolar transistors.

More particularly, the present invention provides a method in which the Ge content profile in the ultra-thin base region of a SiGe HBT device is changed to provide the simultaneous application of lateral compressive and vertical tensile strain. This change in Ge content profile as described by the present invention does not negatively affect, or significantly alter, the quasi-static drift field created by the amount of Ge grading in the ultra-thin base region. By adding a uniform amount of additional Ge to the base Ge content profile and increasing the average Ge content in the ultra-thin base layer to near-critical value, the internal biaxial layer strain can be greatly enhanced up to the apparent and metastable critical point of relaxation.

The critical Ge content for a SiGe base layer of a specific thickness can be readily determined by various methods, as described by J. C. Bean et al., "$Ge_xSi_{1-x}$/Si Strained-Layer Superlattice Grown by Molecular Beam Epitaxy," J. VAC. SCI. TECHNOL., Vol. A2, No. 2, pp. 436-440 (1984); J. H. van der Merwe, "Crystal Interfaces. Part I. Semi-Infinite Crystals," J. APPL. PHYS., Vol. 34, No. 1, pp. 117-122 (1963); J. M. Matthews and A. E. Blakeslee, "Defects in Epitaxial Multilayers I. Misfit Dislocations in Layers," J. CRYSTAL GROWTH, Vol. 27, pp. 118-125 (1974); S. S. Iyer et al., "Heterojunction Bipolar Transistors Using Si-Ge Alloys," IEEE TRANSACTIONS ON ELECTRON DEVICES, Vol. 36, No. 10 (October 1989); R. H. M. van der Leur et al., "Critical Thickness for Pseudomorphic Growth of Si/Ge Alloys and Superlattice," J. APPL. PHYS., Vol. 64, No. 5, pp. 3043-3050 (15 Sept. 1988); and D. C. Houghton et al., "Equilibrium Critical Thickness for $Si_{1-x}Ge_x$ Strained Layers on (100) Si," APPL. PHYS. LETT., Vol. 56, No. 5, pp. 460-462 (29 Jan. 1990).

Figure 6:
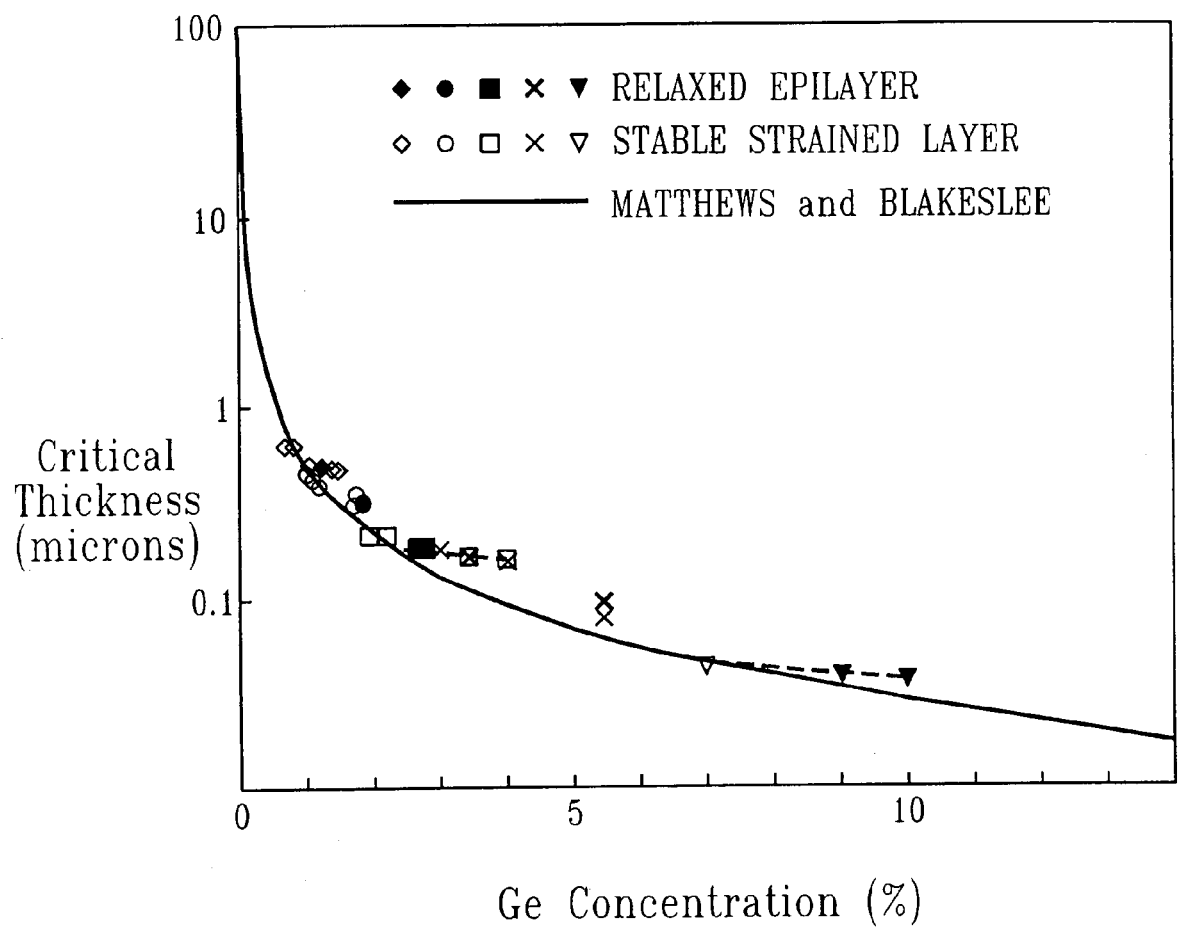
FIG. 6 shows a Matthews-Blakeslee curve that can be used for determining the critical Ge content for a SiGe-containing layer based on its thickness.

FIG. 6 shows a Matthews-Blakeslee curve that correlates the critical thickness of a SiGe-containing film with the Ge content therein, which can be readily used to determine the critical Ge content giving a specific thickness of the SiGe film.

The critical Ge contents calculated by using different methods may differ slightly from one another, due to the different models used and different parameters considered. The present invention selects the average calculated critical germanium content for controlling the actual germanium content in the SiGe-containing layer. For example, for a SiGe-containing layer of about 50 nm thick, the calculated critical germanium content is between about 16 atomic % to about 18 atomic %, while the value of 17 atomic % is selected as the predetermined critical germanium content in the present invention. For another example, the calculated critical germanium content of a 100 nm thick SiGe-containing layer is between about 9 atomic % to about 11 atomic %, and the value of 10 atomic % is selected as the predetermined critical germanium content for practice of the present invention.

Preferably, the ultra-thin SiGe base layer with the near-critical Ge content is pseudomorphically grown by chemical vapor deposition (CVD), with well-established process control and proven repeatability and suitable for batch processing and large-scale manufacturing. In addition, CVD process requires no plasma treatment, and the substitutional Ge atoms are electrically inactive, save for minute changes in band structure and ensuring ultra-low contamination levels in the base layers.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims

What is claimed is:

1. A method for enhancing carrier mobility in a heterojunction bipolar transistor that has a SiGe-containing base layer of not more than about 100 nm in thickness, while without changing quasi-static drift field of said base layer, comprising:

measuring the thickness of said SiGe-containing base layer;

calculating a critical germanium content based on the thickness of the SiGe-containing base layer, wherein the calculated critical germanium content of the SiGe-containing base layer is not less than about 10 atomic %;

measuring germanium content in said SiGe-containing base layer to determine germanium content profile of said SiGe-containing base layer; and changing the germanium content profile of the SiGe-containing base layer, by uniformly increasing the germanium content in the SiGe-containing base layer by a sufficient amount so that the changed germanium content profile has an average germanium content of not less than about 80% of the calculated critical germanium content.

2. The method of claim 1, wherein the changed germanium content profile has an average germanium content of not less than about 90% of the calculated critical germanium content.

3. The method of claim 1, wherein the changed germanium content profile has an average germanium content of not less than about 95% of the calculated critical germanium content.

4. The method of claim 1, wherein the changed germanium content profile has an average germanium content of not less than about 99% of the calculated critical germanium content.

5. The method of claim 1, wherein the changed germanium content profile has an average germanium content that is substantially equal to the calculated critical germanium content.

6. The method of claim 1, wherein the SiGe-containing base layer has a graded or stepped germanium content profile, and wherein the average germanium content is calculated by integrating germanium content over the entire SiGe-containing base layer, so as to determine an integrated germanium content, and dividing the integrated germanium content over the thickness of said SiGe-containing base layer.

7. The method of claim 1, wherein the SiGe-containing base layer has a thickness of not more than about 50 nm, and wherein the calculated critical germanium content of the SiGe-containing layer is not less than about 17 atomic %.

8. The method of claim 1, wherein the heterojunction bipolar transistor further comprises two epitaxial semiconductor layers, and wherein the SiGe-containing base layer is sandwiched between said two epitaxial semiconductor layers.

9. The method of claim 8, wherein germanium contents of said two epitaxial semiconductor layers remain the same after change of the germanium content profile in the SiGe-containing base layer.

10. The method of claim 8, wherein germanium contents of said two epitaxial semiconductor layers uniformly increases by the same amount as that in the SiGe-containing base layer.

11. A method for fabricating a heterojunction bipolar transistor having a SiGe-containing base layer, comprising:

determining a projected thickness and a projected germanium profile for a SiGe-containing base layer of said SiGe-based HET device, wherein said projected thickness is not more than about 100 nm;

calculating a critical germanium content based on the projected thickness and an average germanium content based on the projected germanium profile and the critical germanium content, wherein said average germanium content is not less than 80% of said critical germanium content and the calculated critical germanium content of the SiGe-containing base layer is not less than about 10 atomic %;

forming a collector for the SiGe-based HBT device in a semiconductor substrate;

depositing over the collector a SiGe-containing base layer, which has the projected thickness, the projected germanium profile, and the calculated average germanium content; and forming an extrinsic base and an emitter for the SiGe-based HBT device.

12. The method of claim 11, wherein the average germanium content of the SiGe-containing base layer is not less than about 95% of the calculated critical germanium content.

13. The method of claim 11, wherein the projected thickness of the SiGe-containing base layer is not more than about 50 nm, and wherein the calculated critical germanium content for the SiGe-containing layer is not less than about 17 atomic %.

14. The method of claim 11, further comprising the steps of depositing two epitaxial semiconductor layers, wherein the SiGe-containing base layer is sandwiched between said two epitaxial semiconductor layers.

15. The method of claim 14, wherein the two epitaxial semiconductor layers both consists essentially of silicon.

16. A method for enhancing carrier mobility in a heterojunction bipolar transistor that has a SiGe-containing base layer of not more than about 100 nm in thickness, while without changing quasi-static drift field of said base layer, comprising:

measuring the thickness of said SiGe-containing base layer;

calculating a critical germanium content based on the thickness of the SiGe-containing base layer;

measuring germanium content in said SiGe-containing base layer to determine germanium content profile of said SiGe-containing base layer; and changing the germanium content profile of the SiGe-containing base layer, by uniformly increasing the germanium content in the SiGe-containing base layer by a sufficient amount so that the changed germanium content profile has an average germanium content of not less than about 80% of the calculated critical germanium content, said heterobipolar transistor farther comprises two epitaxial semiconductor layers, and said SiGe-containing base layer is sandwiched between said two epitaxial semiconductor layers, and wherein the germanium contents of said two epitaxial semiconductor layers remain the same after change of the germanium content profile in the SiGe-containing base layer or the germanium contents of said two epitaxial semiconductor layers uniformly increases by the same amount as tat in the SiGe-containing base layer.

17. A method for fabricating a heterojunction bipolar transistor having a SiGe-containing base layer, comprising:

determining a projected thickness and a projected germanium profile for a SiGe-containing base layer of said SiGe-based HBT device, wherein said projected thickness is not more than about 100 nm;

calculating a critical germanium content based on the projected thickness and an average germanium content based on the projected germanium profile and the critical germanium content, wherein said average germanium content is not less than 80% of said critical germanium;

forming a collector for the SiGe-based HBT device in a semiconductor substrate;

depositing over the collector a SiGe-containing base layer, which has the projected thickness, the projected germanium profile, and the calculated average germanium content; and forming an extrinsic base and an emitter for the SiGe-based HBT device, wherein the projected thickness of the SiGe-containing base layer is not more than about 50 nm, and wherein the calculated critical germanium content for the SiGe-containing layer is not less than about 17 atomic %.

* * * * *